United States Patent [19]

Ishizuka et al.

[11] Patent Number: 5,507,873
[45] Date of Patent: Apr. 16, 1996

[54] VERTICAL BOAT

[75] Inventors: Yutaka Ishizuka; Yoshiyuki Watanabe; Tatsuo Nozawa, all of Nishiokitama; Shinzi Sawanobori, Sagamihara; Tomio Kon, Hadano, all of Japan

[73] Assignee: Toshiba Ceramics Co., Ltd., Tokyo, Japan

[21] Appl. No.: 465,607

[22] Filed: Jun. 5, 1995

Related U.S. Application Data

[63] Continuation of Ser. No. 151,376, Nov. 12, 1993.

[30] Foreign Application Priority Data

Nov. 30, 1992 [JP] Japan .................................. 4-341020

[51] Int. Cl.$^6$ .................................................. B05C 13/02
[52] U.S. Cl. .......................... 118/728; 118/500; 118/715; 432/253
[58] Field of Search ..................... 118/728, 729, 118/500, 715, 724, 725; 432/253

[56] References Cited

U.S. PATENT DOCUMENTS 4,412,812  11/1983  Sadowski et al. ..................... 118/729
4,981,222   1/1991  Lee ......................................... 118/728

FOREIGN PATENT DOCUMENTS 62-128633   8/1987  Japan .
63-278225  11/1988  Japan .................................. 118/728
4-6826      1/1992  Japan .................................. 118/728

Primary Examiner—R. Bruce Breneman
Assistant Examiner—Rodney G. McDonald
Attorney, Agent, or Firm—Foley & Lardner

[57] ABSTRACT

A vertical boat for holding a plurality of semiconductor wafers comprising two end members (5) positioned at the top and the bottom of the vertical boat, and a plurality of support members (3,4) vertically mounted on the end members (5), the support members (3,4) including two front support members (3) located on the wafer inserting side and at least one rear support members (4) located on the rear side of the boat, each support member (3,4) having a series of slits (3a,4a) formed thereon at a predetermined interval and a series of support portions defined by the slits (3a,4a) for supporting semiconductor wafers (1), wherein the front support member (3) is generally formed by a circular arc plate, and wherein each angle (A,B) formed between the wafer inserting direction (X) and a line linking the front end (3b) of the support portion of the front support member (3) to the center (1a) of the wafer (1) is 100 degrees or more.

17 Claims, 2 Drawing Sheets

VERTICAL BOAT

This application is a continuation of application Ser. No. 08/151,376, filed Nov. 12, 1993.

BACKGROUND OF THE INVENTION

The invention relates to a vertical boat for holding a plurality of semiconductor wafers, which comprises two end members and a plurality of support members vertically mounted on the end members.

In an oxidation and/or a diffusion process, a wafer boat loaded with a plurality of semiconductor wafers is transferred into a diffusion furnace, and the wafers are subjected to a predetermined heat treatment.

Either a vertical boat or a horizontal boat is selected according to the type of the diffusion furnace.

A conventional vertical boat is shown in FIG. 1, which has two end plates (not shown) and a plurality of, for example four, vertical support bars 2 mounted on the end plates. A plurality of wafers 1 are held in horizontal or somewhat inclined manner on the vertical boat. A plurality of slits 2a are formed on the support members 2 at a predetermined interval for receiving semiconductor wafers 1.

In FIG. 1 each support bar 2 is exaggerated to be thick for easy understanding, however it is actually slender.

In the conventional vertical boat all support members 2 have, normally, the same configuration in cross section. The support member 2 is, for instance, a triangle bar or a rectangle bar. Each slit 2a formed on such a bar member has relatively a small support portion for supporting the wafer 1. The support portion has only a small extension in the circumferencial direction of the wafer 1. Two front support members are normally positioned at two ends of the diameter of the wafer 1 perpendicular to the wafer inserting direction X.

During heat treatments not only wafers 1 but the boat, regardless of its shape, is heated up to a high temperature. The larger the wafer 1 is, the more it is apt to be deflected by its own weight when heated up to a high temperature.

When the wafer is properly placed on the support members 2 of the conventional boat, the angle formed between the wafer inserting direction X and a line linking a front edge of the front support member to the gravity center of the wafer 1 is about 90 degrees, or at the most greater than 90 degrees by a few degrees.

In such a positioning, the gravity center of the wafer 1 is approximately located between the front edges of the two front support members 2 or its neighborhood so that the load of the wafers is biased on the two front support members. As a result, the two front support members share, for example, 70–90% of the weight of the wafers.

Therefore the larger the-wafers are, the more frequently slips are caused. Slips are caused by stress concentration especially at the portions engaging with the support members 2. Slip means crystal defect or crystal dislocation.

On the other hand, Japanese Utility Model laid open No. 62-128633 discloses a boat which comprises a plurality of circular arc plates fixed on support bars, wherein the loading stress of the large wafer can be somewhat relaxed. However, this boat is expensive because the circular arc plate must have a very accurate surface on which the wafer is to be placed.

SUMMARY OF THE INVENTION

An object of the present invention is to provide a vertical boat wherein no slip dislocation is caused and the deflection of the wafer is considerably decreased even when the large wafers are held thereon.

According to the present invention a vertical boat for holding a plurality of semiconductor wafers is provided, which comprises two end members, one of which is positioned at the top and the other which is positioned at the bottom of the vertical boat, and a plurality of support members vertically mounted on the end members, the support members including two front support members located on the wafer inserting side and at least one rear support member located on the rear side of the boat, each support member having a series of slits formed thereon at predetermined intervals and a series of support portions defined by the slits for supporting semiconductor wafers, wherein each front support member is generally formed by a circular arc plate, and wherein each angle formed between a line in the wafer inserting direction and a line linking the front end of the support portion of the front support member to the center of the wafer is 100 degrees or more.

When semiconductor wafers are properly placed on the vertical boat according to the present invention, each angle formed between a line in the wafer inserting direction and a line linking the front end of the support portion to the center of the wafer is 100 degrees or more. Thus, the gravity center of the wafer is positioned moderately inside the line connecting two front ends of the support portions of the front support members. As a result, stress concentration on the wafer can be decreased and defects of the wafer, for example, slip dislocations can be inhibited.

If each angle formed between a line in the wafer inserting direction and a line linking the front end of the front support portion to the center of the wafer is less than 100 degrees, stress concentration on the wafer cannot be sufficiently decreased. Each of the angle is preferably 115 degrees or more.

DISCRIPTION OF THE PREFERRED EMBODIMENTS

Figure 1:
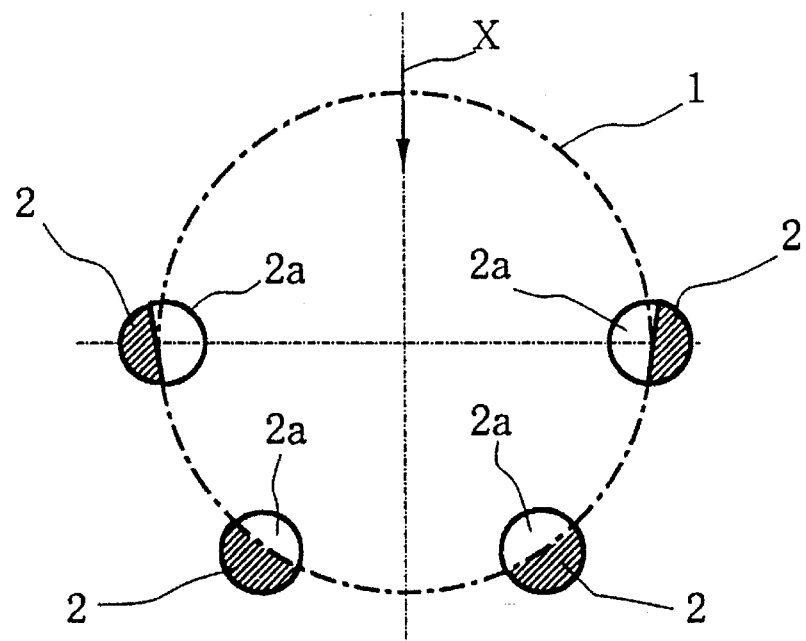
FIG. 1 is a schematic sectional view showing a vertical boat of prior art.
Figure 2:
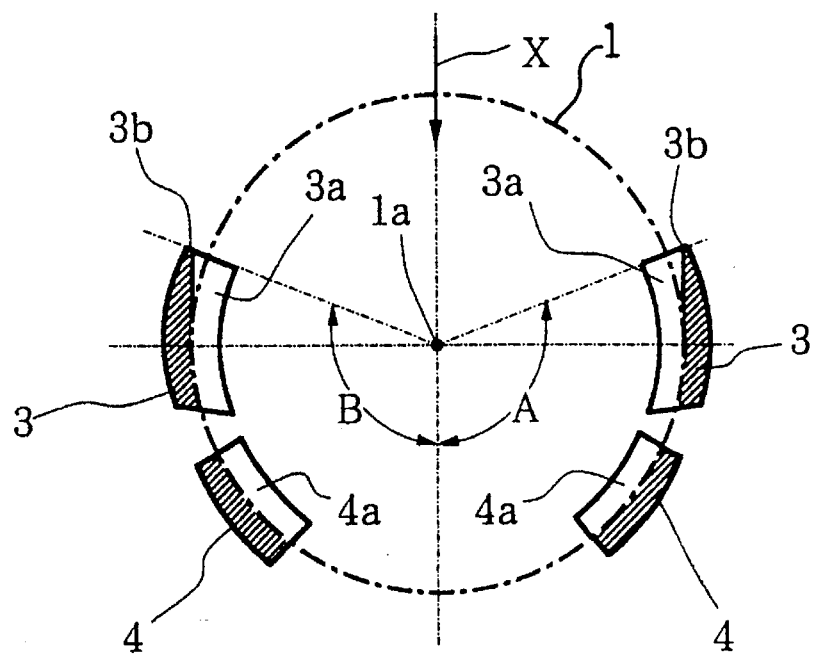
FIG. 2 is a schematic sectional view showing a first embodiment of a vertical boat according to the present invention.

FIG. 2 shows a first embodiment of a vertical boat according to the present: invention. The vertical boat comprises two end members (not shown) located on the top and the bottom of the boat and four support members 3,4 vertically mounted on the end members. The support members consist of two front support members 3,3 and two rear support members 4,4. The front support members 3,3 are positioned on the wafer inserting side of the boat. The rear support members 4,4 are positioned on the rear side of the boat. The front support members 3,3 are generally formed by the same circular arc plates. The rear support member 4 is formed by the same circular arc plate as the front member 3, while the rear support member 4 has a smaller circumferential angle than the front support member 3. In other words, the support members 3 and 4 are the same in radius of curvature whereas different in width.

A series of slits 3a,4a are formed on the front and the rear support members 3, 4, respectively, at predetermined intervals. A series of front support portions and a series of rear support portions for supporting the wafers 1 are defined by the slits 3a,4a on the front and the rear support members 3, 4, respectively.

The slit 3a of a front support member 3 and the slit 4a of a rear support member 4 have different shapes. The bottom of the slit 3a is parallel to a line in the wafer inserting direction X. Thus, the bottom of the slit 3a substantially abuts the wafer 1 an a plane including the central axis of the boat and perpendicular to the wafer inserting direction X. While the slit 4a of the rear support member 4 has a circular arc bottom corresponding to the peripheral circle of the wafer 1. The wafer 1 is placed on the boat in such a manner that its center 1a is substantially positioned on the central axis of the boat.

When the wafer 1 is properly placed on the vertical boat, each angle A,B formed between a line in the wafer inserting direction X and a line linking the front end 3b of the front support portion of the front support member 3 to the center 1a of the wafer 1 is about 118 degrees.

The support members 3,4 are formed by a circular arc plate having a circumferential angle of 30–40 degrees about the center 1a of the wafer 1 in FIG. 2. The slit 3a,4a has a depth of 3–7 mm. Not only the support members 3,4 but the slits 3a,4a are symmetrical with respect to the plane including the central axis of the boat and parallel to the wafer inserting direction X.

Figure 3:
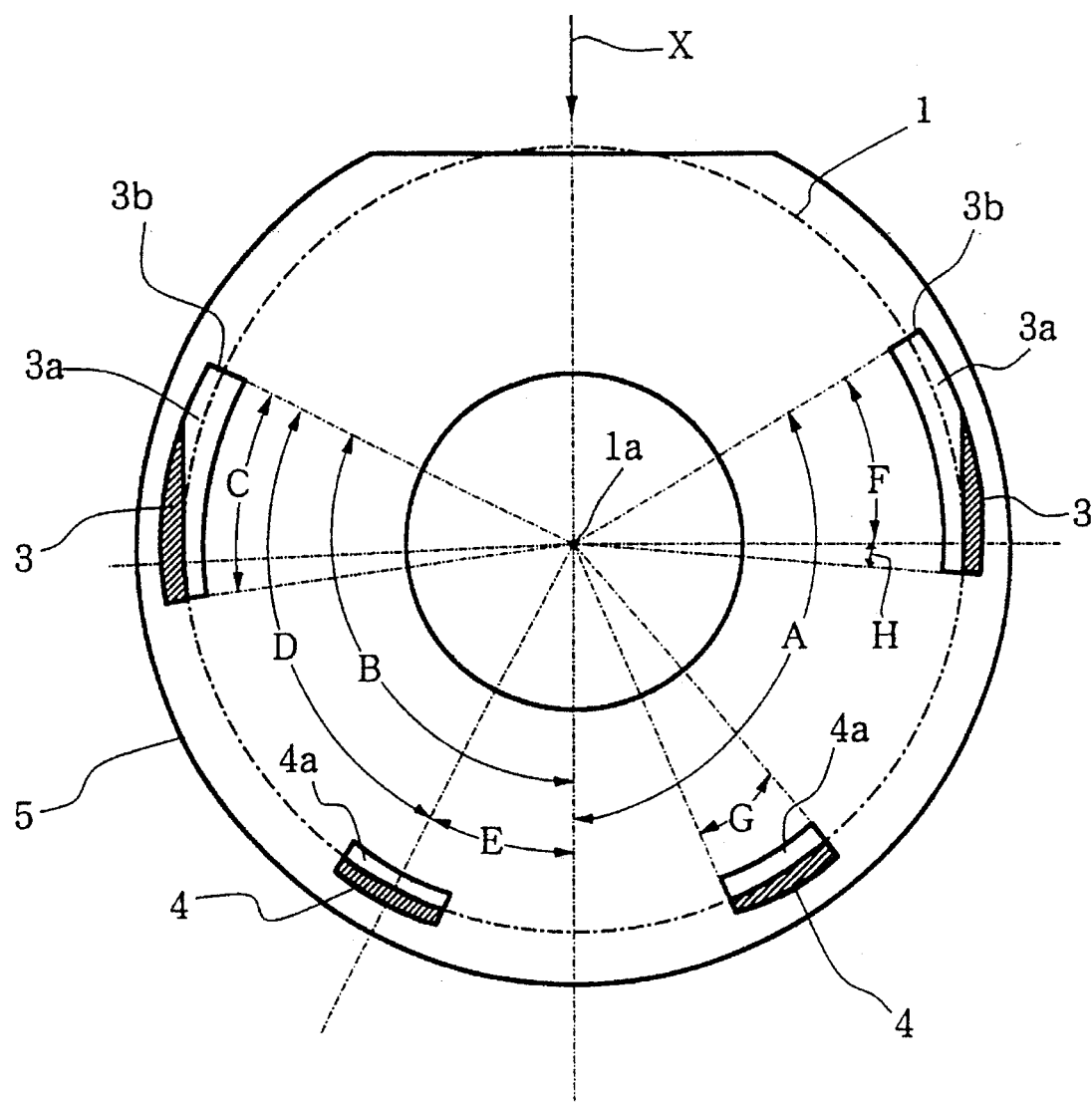
FIG. 3 is a schematic sectional view showing a second embodiment according to the present invention.

FIG. 3 shows a second embodiment according to the present invention.

One of two end members 5 is located on the top and the second member is located on the bottom of the vertical boat. However only the bottom end member 5 is shown in FIG. 3. Four support members 3,4 are vertically mounted on the end members 5 so as to be parallel to each other. A pair of front support members 3,3 are positioned on the wafer inserting side and the other pair of rear support members 4,4 are positioned on the rear side of the boat. Two front support members 3 are positioned so as to face each other with the wafers 1 therebetween, while two rear support members 4 are positioned so as to face the center 1a of the wafer 1.

Each support members 3,4 has a constant thickness. The inner and the outer circumference of the support members 3,4 are almost concentric to the periphery of the wafer 1.

A series of slits 3a are formed on the front support member 3. The slit bottoms are parallel to a line in the wafer inserting direction X in such a manner that the wafer 1 placed on the boat substantially abuts the slit bottoms. A series of front support portions are defined by the slits 3a for supporting the wafers 1.

The rear support member 4 is formed by relatively a narrow circular arc plate so that a light-weight construction is provided. A series of slits 4a are formed on the rear support member 4. The slits 4a are arc-shaped and correspond to the periphery of the wafer 1. A series of rear support portions are difined by the slits 4a for supporting the wafers 1.

When the wafer 1 is placed properly on the vertical boat of as shown in FIG. 3, each angle A,B formed between a line in the wafer inserting direction X and a line linking the front edges 3b of the front support members 3 to the center 1a of the wafer is about 120 degrees.

Each front support member 3 is formed by a circular arc plate having a width of 64 mm. Its circumferential angle C around the center 1a of the wafer 1 is about 36 degrees. The slits 3a have a depth of 3–10 mm. Each rear support member 4 is formed by a circular arc plate having a width of 30 mm. The slits 4a have a depth of 3–10 mm.

Not only the support members 3,4 but the slits 3a,4a are symmetrical with respect to the plane including the central axis of the boat and parallel to the wafer inserting direction X.

In FIG. 3, the angles D,E,F,G and H are, for example, about 90,30,33,17 and 3 degrees, respectively.

The support members 3,4 can be formed by the following steps. First a pipe member is vertically divided so as to provide a circular arc plate having a predetermined circumferential angle. The outer diameter of the pipe member is larger than the diameter of the pipe member of the wafer 1, and the inner diameter is smaller than the diameter of the wafer 1. A series of slits 3a,4a are formed on the circular arc plates for receiving a predetermined number of wafers. By the slits 3a,4a a series of support portions are defined on the support members 3,4, respectively. Thereafter the support members are fixed on the end members. However, the slits can be formed after the support members are fixed on the end members.

The present invention is not restricted to the discribed embodiments. The rear support members 4, for example, can be a single support member. It may be a round bar. The angles A,B can be different from each other.

The slits 3a of the front support members 3 are parallel to a line in the wafer inserting direction X in embodiments of FIGS. 2, 3, however, the slits 3a can be widened outwards.

Table 1 shows values of stress and displacement of the wafer placed on the vertical boat as caluculated by computer-assisted simulation in both cases the present invention and the prior art. According to Table 1, stress and displacement of the wafer in case of the present invention are much smaller than that of the prior art.

TABLE 1

|  | maximum value of displacement (mm) | equivalent stress (Mpa) | maximum principal stress (Mpa) |
| --- | --- | --- | --- |
| the present invention | 0.0180 | 0.6367 | 0.6984 |
| the priot art | 0.1158 | 1.5010 | 1.7220 |

|  | radial stress (Mpa) | circumferential stress (Mpa) |
| --- | --- | --- |
| the present invention | 0.1678 | 0.6841 |
| the priot art | 0.6956 | 1.7180 |

(Maximum principal stress, radial stress and circumferential stress are supposed to be caused on the surface of the wafer.)

What is claimed is:

1. A vertical boat for holding a plurality of semiconductor wafers comprising:

two end members, one of which is positioned at a top portion and the other which is positioned on a bottom portion of the vertical boat; and a plurality of support members vertically extending between and mounted on the end members, the support members including two front support members located on a side of the vertical boat where the wafer is inserted and at least one rear support member located on a rear side of the vertical boat, the front support members and the at least one rear support member being separated from each other, each of the front support members and the at least one rear support member having a series of slits formed along their lengths, the series of slits defining a series of support portions for supporting a plurality of semiconductor wafers, wherein each of the front support members is a one-piece type circular arc plate having a substantially constant thickness, and wherein both an outer circumference and inner circumference of the plate are substantially concentric to the periphery of the wafer when the wafer is set in position within the boat, and wherein each of two angles (A,B) formed between a line in the wafer inserting direction (X) and a line linking the front end of the support portion of each front support member to the center of the wafer is at least 100 degrees.

2. A vertical boat according to claim 1, wherein each angle (A,B) is at least 115 degrees.

3. A vertical boat according to claim 1, wherein the two angles (A,B) are substantially the same.

4. A vertical boat according to claim 1, wherein the series of slits of the front support members are formed so as to open outwards.

5. A vertical boat according to claim 1, wherein the vertical boat is provided with two rear support members.

6. A vertical boat according to claim 1, wherein an angle (H) of about 3 degrees is formed between a line which links the rear end of the support portion of each front support member (3) to the center (1a) of the wafer and a line which passes through the center (1a) of the wafer and is perpendicular to the wafer inserting direction (X).

7. A vertical boat according to claim 1, wherein the rear support member is a one-piece type circular arc plate having a substantially constant thickness, and both an outer circumference and an inner circumference of the plate are substantially concentric to the periphery of the wafer when the wafer is set in position within the boat.

8. A vertical boat according to claim 1, wherein each of the front support members is a one-piece type plate which is a circular arc plate-having a circumferential angle of 30 to 40 degrees about the center (1a) of the wafer.

9. A vertical boat according to claim 1, wherein the front support members are formed by vertically dividing a pipe member.

10. A vertical-boat according to claim 1, wherein the front and rear support members are formed by vertically dividing a pipe member.

11. A vertical boat for holding a plurality of semiconductor wafers comprising:

the vertical boat having a top portion and a bottom portion;

a top end member placed at the top portion of the vertical boat;

a bottom member placed at the bottom portion of the vertical boat;

a plurality of support members extending vertically between the top member and the bottom member and fixed thereto;

the support members including two front support members and at least one rear support member all of which extend vertically between the top member and the bottom member and are fixed thereto;

each of the front support members and the rear support member having a series of slits formed thereon and a series of support portions defined by the slits for supporting the wafers;

the front support members being formed from part of a pipe member in the shape of a circular arc extending vertically between the top end member and the bottom end member and being separate from each other and from the rear support member.

12. A vertical boat according to claim 11, wherein when the wafers are inserted into the slits so as to be supported by the support portions in a wafer insertion direction, an angle (A,B) formed between the wafer inserting direction and a line linking the front end of the support portions of the front support members to a center (1a) of the wafers is at least 115 degrees.

13. A vertical boat according to claim 11, wherein an angle (H) of about 3 degrees is formed between a line which links the rear end of the support portion of each front support member (3) to the center (1a) of the wafer and a line which passes through the center (1a) of the wafer and is perpendicular to the wafer inserting direction (X).

14. A vertical boat according to claim 11, wherein the rear support member is a one-piece type plate having a substantially constant thickness, and both an outer circumference and an inner circumference of the plate are substantially concentric to the periphery of the wafer when the wafer is set in position within the boat.

15. A vertical boat according to claim 11, wherein each of the front support members is a one-piece type plate which is a circular arc plate having a circumferential angle of 30–40 degrees about,the center (1a) of the wafer.

16. A vertical boat according to claim 11, wherein the front support members are formed by vertically dividing a pipe member.

17. A vertical boat according to claim 11, wherein the front and rear support members are formed by vertically dividing a pipe member.

* * * * *